United States Patent
Mukherjee et al.

(10) Patent No.: US 11,569,712 B2
(45) Date of Patent: Jan. 31, 2023

(54) SYSTEM AND METHOD FOR DETECTING BEARING INSULATION AND GROUND BRUSH HEALTH IN A GENERATOR

(71) Applicant: General Electric Renovables Espana, S.L., Barcelona (ES)

(72) Inventors: Rupam Mukherjee, Bangalore (IN); Kapil Jha, Bangalore (IN); Arvind Kumar Tiwari, Niskayuna, NY (US); Kum Kang Huh, Niskayuna, NY (US); Robert Gregory Wagoner, Roanoke, VA (US)

(73) Assignee: General Electric Renovables Espana, S.L., Barcelona (ES)

( * ) Notice: Subject to any disclaimer, the term of this patent is extended or adjusted under 35 U.S.C. 154(b) by 0 days.

(21) Appl. No.: 17/221,977

(22) Filed: Apr. 5, 2021

(65) Prior Publication Data
US 2022/0321039 A1  Oct. 6, 2022

(51) Int. Cl.
*H02P 9/00* (2006.01)
*H02K 7/18* (2006.01)
(Continued)

(52) U.S. Cl.
CPC ............ *H02K 7/183* (2013.01); *G01R 25/00* (2013.01); *G01R 27/18* (2013.01);
(Continued)

(58) Field of Classification Search
CPC ........ G01R 31/52; G01R 25/00; G01R 27/18; G01R 31/1263; H02K 7/183; H02P 9/02; H02P 9/006; H02P 9/007
See application file for complete search history.

(56) References Cited

U.S. PATENT DOCUMENTS

| | | | |
|---|---|---|---|
| 4,851,949 A | | 7/1989 | Lemak et al. |
| 4,939,506 A | * | 7/1990 | Gram ............ H02H 5/105 340/649 |

(Continued)

FOREIGN PATENT DOCUMENTS

| | | |
|---|---|---|
| CN | 201335880 Y | 10/2009 |
| CN | 101340083 B | 1/2011 |

(Continued)

OTHER PUBLICATIONS

Furuta et al., Accurate Detection of Secondary Current in Shaft Hole of Induction Motors for Reliable Controls, IEEE Transactions on Magnetics, vol. 35, Issue 5, Sep. 1999, pp. 3595-3597. Abstract Only https://ieeexplore.ieee.org/stamp/stamp.jsp?arnumber=800601 https://doi.org/10.1109/20.800601.
(Continued)

*Primary Examiner* — Sean Gugger
(74) *Attorney, Agent, or Firm* — Dority & Manning, P.A.

(57) ABSTRACT

A method for preventing damage in a bearing of a generator of an electrical power system includes monitoring one or more electrical signals of a power conversion assembly of the electrical power system. The method also includes estimating an impedance path of common mode current from a terminal to ground using the operating parameter(s) of the power conversion assembly. Further, the method includes determining a one or more magnitudes and/or a one or more phase angles of the impedance path at different frequencies, such a switching frequency and/or harmonics. Moreover, the method includes determining whether the impedance path is indicative of degradation in at least one of bearing insulation or a ground brush of the generator based on a change in the one or more magnitudes and/or the one or more phase angles. In addition, the method includes implementing a control action when the impedance path is indicative of degradation in the bearing insulation and/or the ground brush of the generator.

20 Claims, 8 Drawing Sheets

(51) Int. Cl.
  *H02P 9/02* (2006.01)
  *G01R 25/00* (2006.01)
  *G01R 31/52* (2020.01)
  *G01R 31/12* (2020.01)
  *G01R 27/18* (2006.01)
(52) U.S. Cl.
  CPC ......... *G01R 31/1263* (2013.01); *G01R 31/52* (2020.01); *H02P 9/006* (2013.01); *H02P 9/007* (2013.01); *H02P 9/02* (2013.01)

(56) References Cited

U.S. PATENT DOCUMENTS

| | | | |
|---|---|---|---|
| 7,337,613 | B2 | 3/2008 | Bellows |
| 8,396,677 | B2 | 3/2013 | Hobelsberger et al. |
| 8,587,325 | B2 | 11/2013 | Pekola et al. |
| 8,610,591 | B2 | 12/2013 | Kretschmer et al. |
| 10,138,872 | B2 | 11/2018 | Carr et al. |
| 2010/0133854 | A1 | 6/2010 | Jansen et al. |
| 2010/0329867 | A1 | 12/2010 | Patel et al. |
| 2018/0080434 | A1* | 3/2018 | Carr ................... H02P 9/007 |

FOREIGN PATENT DOCUMENTS

| | | |
|---|---|---|
| CN | 202083733 U | 12/2011 |
| CN | 202305043 U | 7/2012 |
| CN | 103439099 A | 12/2013 |
| CN | 103439176 A | 12/2013 |
| CN | 103592504 A | 2/2014 |
| CN | 203422272 U | 2/2014 |
| CN | 203534800 U | 4/2014 |
| CN | 203616384 U | 5/2014 |
| CN | 103846735 A | 6/2014 |
| CN | 204346355 U | 5/2015 |
| CN | 105548655 A | 5/2016 |
| CN | 105974241 A | 9/2016 |
| CN | 205880074 U | 1/2017 |
| CN | 105867512 B | 5/2017 |
| CN | 207096309 U | 3/2018 |
| CN | 106093548 B | 12/2018 |
| CN | 208433876 U | 1/2019 |
| CN | 109324217 A | 2/2019 |
| CN | 110411323 A | 11/2019 |
| CN | 210090546 U | 2/2020 |
| CN | 210927378 U | 3/2020 |
| DE | 1217493 B | 5/1966 |
| DE | 1613886 A1 | 8/1971 |
| DE | 102013219799 A1 | 4/2015 |
| EP | 2513642 A1 | 10/2012 |
| SU | 114599 A1 | 11/1957 |
| WO | WO9917126 A1 | 4/1999 |
| WO | WO2006134068 A1 | 12/2006 |
| WO | WO2009071656 A1 | 6/2009 |
| WO | WO2016157347 A1 | 10/2016 |

OTHER PUBLICATIONS

Ifurung, Shaft Current on Large Wound Rotor Motor: Generation, Detection, Measurement and Mitigation, 2013 IEEE-IAS/PCA Cement Industry Technical Conference, Orlando, FL, 2013, pp. 1-35. Abstract Only https://ieeexplore.ieee.org/stamp/stamp.jsp?arnumber=6525286 https://doi.org/10.1109/CITCON.2013.6525286.

Liu et al., Research on Bearing Current Detection Method of High-Speed Motor Driven by PWM Inverter, 2019 22nd International Conference on Electrical Machines and Systems (ICEMS), Harbin, China, 2019, pp. 1-6. Abstract Only https://ieeexplore.ieee.org/stamp/stamp.jsp?arnumber=8922050 https://doi.org/10.1109/ICEMS.2019.8922050.

Ong et al., Shaft Current in AC Induction Machine: An On-Line Monitoring System and Prediction Rules, IEEE Xplore, Conference Record of the 2000 IEEE Industry Applications Conference. Thirty-Fifth IAS Annual Meeting and World Conference on Industrial Applications of Electrical Energy (Cat. No. 00CH37129), Rome, Italy, Oct. 8-12, 2000, 2 Pages. Abstract Only. https://ieeexplore.ieee.org/stamp/stamp.jsp?arnumber=883222 https://doi.org/10.1109/IAS.2000.883222.

Ong et al., Shaft Current in AC Induction Machine. An On-Line Monitoring System and Prediction Rules, IEEE Xplore, Journals & Magazines, IEEE Transactions on Industry Applications, vol. 37, Issue 4, Jul./Aug. 2001, pp. 1189-1196. Abstract Only https://ieeexplore.ieee.org/stamp/stamp.jsp?arnumber=936413 https://doi.org/10.1109/28.936413.

Parata et al., Accurate Detection of Secondary Current in Shaft Hole of Induction Motors for Reliable Controls, 1999 IEEE International Magnetics Conference (INTERMAG), Kyongju, Korea, 1999, pp. HF06-HF06. Abstract Only https://ieeexplore.ieee.org/stamp/stamp.jsp?arnumber=838028 https://doi.org/10.1109/INTMAG.1999.838028.

Singh et al., A Non-Intrusive Methodology for Bearing Current Detection in PWM Inverter Fed Induction Motor Drive, IEEE Xplore, 2018 International Conference on Power, Instrumentation, Control and Computing (PICC), Thrissur, India, Jan. 18-20, 2018, 3 Pages. Abstract Only https://ieeexplore.ieee.org/stamp/stamp.jsp?arnumber=8384807.

Singleton et al., The Use of Bearing Currents and Vibrations in Lifetime Estimation of Bearings, IEEE Xplore, Journals & Magazines, IEEE Transactions on Industrial Informatics, vol. 13, Issue 3, Jun. 2017, pp. 1301-1309. Abstract Only https://ieeexplore.ieee.org/stamp/stamp.jsp?arnumber=7795228 https://doi.org/10.1109/TII.2016.2643693.

Tischmacher et al., Multiple Signature Analysis for the Detection of Bearing Currents and the Assessment of the Resulting Bearing Wear, IEEE Xplore, International Symposium on Power Electronics Power Electronics, Electrical Drives, Automation and Motion, Sorrento, Italy, 2012. Abstract Only https://ieeexplore.ieee.org/stamp/stamp.jsp?arnumber=6264380 https://doi.org/10.1109/SPEEDAM.2012.6264380.

The EP Search Report for EP application No. 22165516,0, dated Sep. 6, 2022.

Mohamed Becherif et al., Impedance spectroscopy failure diagnosis of a DFIG-based wind turbine, IECON 2012—38th annual conference on IEEE Industrial Electronics Society, IEEE, Oct. 25, 2012, pp. 4310-4431.

Amirat Y et al., Bearing fault detection in DFIG-based wind turbines using the first Intrinsic Mode Function, 2010 XIX International Conference on Electrical Machines (ICEM), IEEE, Piscataway, NJ, USA, Sep. 6, 2010, pp. 1-6.

* cited by examiner

SYSTEM AND METHOD FOR DETECTING BEARING INSULATION AND GROUND BRUSH HEALTH IN A GENERATOR

FIELD

The present disclosure relates generally to wind turbines and, more particularly, to a system and method for detecting bearing insulation and ground brush health in a doubly-fed induction generator.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy of wind using known airfoil principles. For example, rotor blades typically have the cross-sectional profile of an airfoil such that, during operation, air flows over the blade producing a pressure difference between the sides. Consequently, a lift force, which is directed from a pressure side towards a suction side, acts on the blade. The lift force generates torque on the main rotor shaft, which is geared to a generator for producing electricity.

In many wind turbines, the generator may be electrically coupled to a bi-directional power converter that includes a rotor-side converter joined to a line-side converter via a regulated DC link. Such wind turbine power systems are generally referred to as a doubly-fed induction generator (DFIG). DFIG operation is typically characterized in that the rotor circuit is supplied with current from a current-regulated power converter. As such, the wind turbine produces variable mechanical torque due to variable wind speeds and the power converter ensures this torque is converted into an electrical output at the same frequency of the grid.

During operation, wind impacts the rotor blades and the blades transform wind energy into a mechanical rotational torque that drives a low-speed shaft. The low-speed shaft is configured to drive the gearbox that subsequently steps up the low rotational speed of the low-speed shaft to drive a high-speed shaft at an increased rotational speed. The high-speed shaft is generally coupled to the generator so as to rotatably drive a generator rotor. As such, a rotating magnetic field may be induced by the generator rotor and a voltage may be induced within a generator stator. Rotational energy is converted into electrical energy through electromagnetic fields coupling the rotor and the stator, which is supplied to a power grid via a grid breaker. Thus, the main transformer steps up the voltage amplitude of the electrical power such that the transformed electrical power may be further transmitted to the power grid.

Capacitive coupling between the rotor and the stator, though not the main contributor to the generated power, can induce an undesirable rotor shaft voltage in the rotor. In addition, high common-mode voltage injected through the rotor-side inverter can potentially damage the bearing through Electric Discharge Machining (EDM). Under normal operating conditions, the current driven by the rotor shaft voltage is safely dissipated through a ground brush that is in contact with the rotor and ground. Also, an insulation is provided between the bearing housing and the DFIG frame.

However, wear and tear impacts the conductivity of the brush as well as the insulating capability of the bearing housing insulation. As a result, if the ground brush is not in contact with the rotor, voltage can build up on the rotor shaft. As the voltage builds up, it will discharge to ground using the lowest impedance path. For DFIGs, this path corresponds to the oil in the bearing housing. As such, the voltage can discharge in a pulse, thereby causing an arc. This cycle can be repeated as long as the ground brush is lifted, causing pitting and fluting of the bearing track which ultimately leads to bearing failure. Accordingly, degradations in the bearing insulation and/or the ground brush need to be detected at an incipient stage to prevent EDM-induced bearing damage at a later stage.

Thus, the present disclosure is directed to a system and method for detecting degradation in the bearing insulation and/or the ground brush at an early stage by analyzing data captured in the turbine controller so as to address the aforementioned issues.

BRIEF DESCRIPTION

Aspects and advantages of the present disclosure will be set forth in part in the following description, or may be obvious from the description, or may be learned through practice of the present disclosure.

In one aspect, the present invention is directed to a method for preventing damage in a bearing of a generator of an electrical power system. The electrical power system includes a power conversion assembly with a first converter coupled to a second converter. The power conversion assembly is electrically coupled to the generator. The method includes monitoring, via a controller, one or more electrical signals of the power conversion assembly of the electrical power system. The method also includes estimating, via the controller, an impedance path of common mode current from a terminal to ground using the one or more electrical signals of the power conversion assembly. Further, the method includes determining, via the controller, at least one of a one or more magnitudes or a one or more phase angles of the impedance path at different frequencies. The different frequencies includes, for example, at least, a switching frequency and harmonics of the power conversion assembly. Moreover, the method includes determining, via the controller, whether the impedance path is indicative of degradation in at least one of bearing insulation or a ground brush of the generator based on a change in at least one of the one or more magnitudes or the one or more phase angles. In addition, the method includes implementing, via the controller, a control action when the impedance path is indicative of degradation in at least one of the bearing insulation or the ground brush of the generator.

In an embodiment, the operating parameter(s) may include current and/or voltage collected from the first converter. In certain embodiments, the electrical power system may be a wind turbine power system. In such embodiments, the first converter is a rotor-side converter and the second converter is a line-side converter of the wind turbine power system. Moreover, in an embodiment, the current may be a rotor phase current of the rotor-side converter and the voltage may be a rotor voltage. In additional embodiments, the terminal is a rotor terminal of the wind turbine power system.

In further embodiments, estimating the impedance path of the common mode current from the terminal to ground using the one or more electrical signals of the power conversion assembly may include calculating a common mode voltage and the common mode current using the rotor voltage and the rotor phase current of the rotor-side converter, respectively, calculating a Fourier spectrum of the common mode voltage and the common mode current, and calculating the impedance path from the terminal to the ground as a function of the Fourier spectrum of the common mode voltage and the common mode current.

In another embodiment, determining the one or more magnitudes and/or the one or more phase angles of the impedance path at different frequencies may include calculating the one or more magnitudes of the impedance path at multiple switching frequency sidebands by dividing the Fourier spectrum of the common mode voltage by the Fourier spectrum of the common mode current and calculating the one or more phase angles of the impedance path at multiple switching frequency sidebands by subtracting the Fourier spectrum of the common mode current from the Fourier spectrum of the common mode voltage.

In still further embodiments, determining whether the impedance path is indicative of degradation in the bearing insulation and/or the ground brush of the generator based on the change in at least one of the one or more magnitudes or the one or more phase angles may include comparing the one or more magnitudes of the impedance path at multiple switching frequency sidebands to a magnitude threshold and generating an indication of degradation occurring in the ground brush when the change in the one or more magnitudes exceeds the magnitude threshold.

In particular embodiments, determining whether the impedance path is indicative of degradation in at least one of bearing insulation or the ground brush of the generator based on the change in at least one of the one or more magnitudes or the one or more phase angles may include comparing the one or more phase angles of the impedance path at multiple switching frequency sidebands to a phase angle threshold and generating an indication of degradation occurring in the bearing insulation when the change occurs in the one or more phase angles exceeds the phase angle threshold.

In additional embodiments, the method may include estimating an impedance profile at one or more predetermined frequencies from a Fourier spectra of a plurality of common mode voltages and currents, estimating one or more anomaly metrics using the impedance profile that are indicative of degradation in at least one of the bearing insulation or the ground brush, and trending the anomaly metric(s) over time. Thus, the method may include using one or more data-based approaches after determining the magnitudes(s) and/or phase angles(s) of the impedance path at different frequencies. These different frequencies may be compared against a baseline cluster to estimate a statistical distance metric. This statistical distance metric may then be used to flag one or more anomaly metrics indicative of degradation in the bearing insulation and/or the ground brush that can be trended over time.

In yet another embodiment, the control action may include changing an operating set point of the electrical power system, shutting down the electrical power system, generating an alarm, scheduling a repair, and/or replacing at least one of the bearing insulation or the ground brush.

In several embodiments, the generator may be a doubly-fed induction generator (DFIG).

In another aspect, the present disclosure is directed to an electrical power system connected to a power grid, the electrical power system includes a doubly-fed induction generator (DFIG) comprising a rotor and a stator, a power conversion assembly electrically coupled to the DFIG, and a controller configured to control the electrical power system. The power conversion assembly includes a first converter coupled to a second converter. The controller is configured to perform a plurality of operations, including but not limited to monitoring one or more electrical signals of the power conversion assembly of the electrical power system, estimating an impedance path of common mode current from a terminal to ground using the one or more electrical signals of the power conversion assembly, determining at least one of one or more magnitudes or one or more phase angles of the impedance path at different frequencies, the different frequencies including, at least, a switching frequency and harmonics of the power conversion assembly, determining whether the impedance path is indicative of degradation in at least one of bearing insulation or a ground brush of the DFIG based on a change in at least one of the one or more magnitudes or the one or more phase angles, and implementing a control action when the impedance path is indicative of degradation in at least one of the bearing insulation or the ground brush of the DFIG.

These and other features, aspects and advantages of the present disclosure will become better understood with reference to the following description and appended claims. The accompanying drawings, which are incorporated in and constitute a part of this specification, illustrate embodiments of the present disclosure and, together with the description, serve to explain the principles of the present disclosure.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
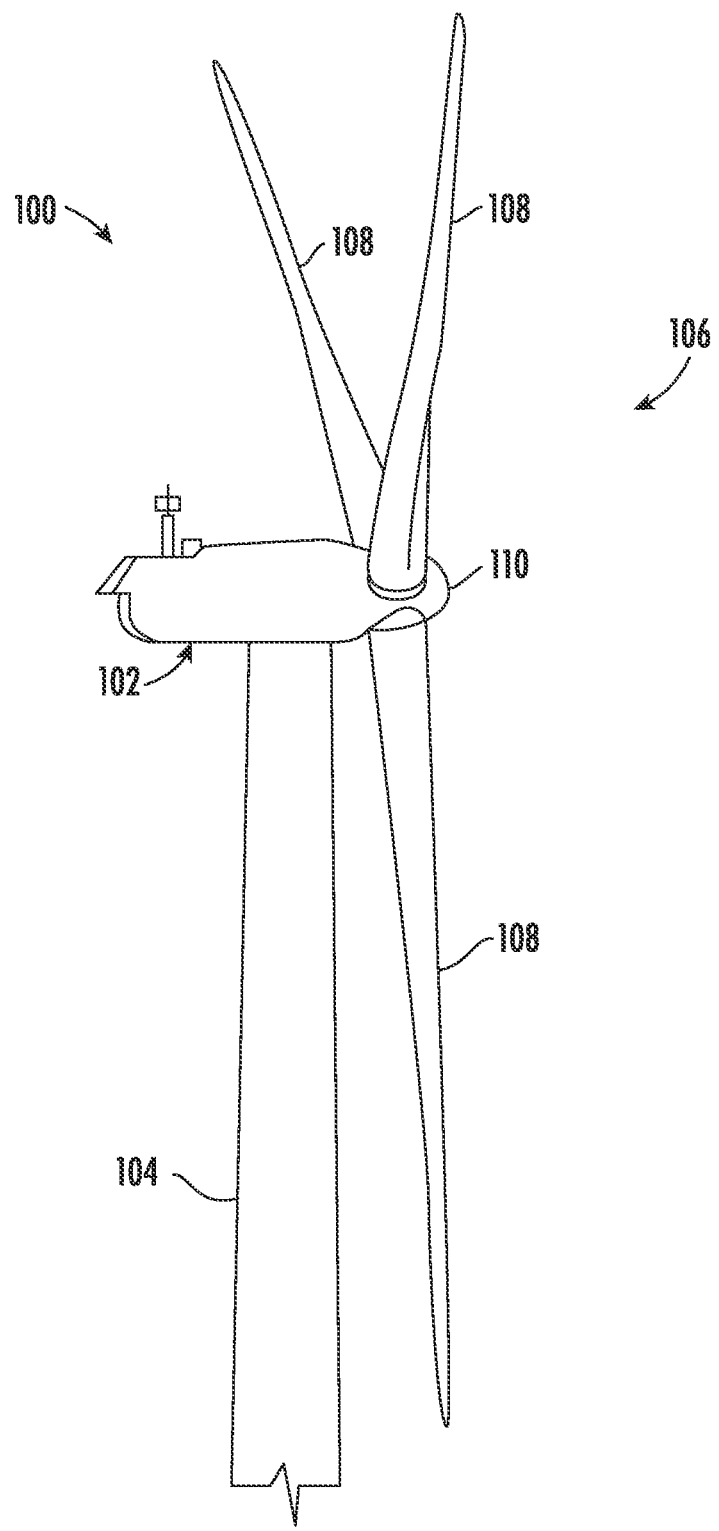
FIG. 1 illustrates a perspective view of a portion of one embodiment of a wind turbine according to the present disclosure.

Reference now will be made in detail to embodiments of the present disclosure, one or more examples of which are illustrated in the drawings. Each example is provided by way of explanation of the present disclosure, not limitation of the present disclosure. In fact, it will be apparent to those skilled in the art that various modifications and variations can be made in the present disclosure without departing from the scope or spirit of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

Generally, the present invention is directed to a system and method for preventing damage in a bearing (e.g., damage to the bearing insulation or ground brush) of a generator (such as DFIG) of an electrical power system (such as a wind turbine power system) connected to a power grid. In particular, in an embodiment, three-phase currents and voltages injected by the rotor-side inverter may be analyzed to estimate the impedance of the path of the common mode current from the rotor terminal to the ground. The common mode input impedance from the rotor terminals is estimated and changes in the impedance phase angle and magnitude is used to detect transformation of the impedance from primarily inductive in nominal condition to primarily capacitive in a degraded condition.

In particular, the magnitude and phase profile of the common mode impedance at different frequencies (including the switching frequency and its harmonics) indicates whether the path is behaving anomalously. For example, a change in the magnitude may indicate partial degradation of the ground brush, whereas a change in the phase angle may indicate a dissipation factor change bearing insulation. In one embodiment, a complex fast Fourier transform (FFT) may be taken for the rotating vector of three-phase rotor currents. One or more bearing frequency components may be tracked and changes in shape (measured by entropy) and peak size/location of these frequency components indicate progressive bearing damage through EDM. In addition, in certain embodiments, data-based approaches may be used after estimating the impedance profile, in order to flag anomalies and trend the anomaly growth over time.

As such, the present disclosure provides many advantages not present in the prior art. For example, systems and methods of the present disclosure can achieve brush diagnostics without the need for any separate sensor for measuring shaft voltage and/or leakage path current. Rather, as mentioned, systems and methods of the present disclosure use inverter electrical signals for ground-brush diagnostics. In particular, in an embodiment, systems and methods of the present disclosure estimate ground-brush health through frequency spectrum analysis of the common-mode look-in impedance. Moreover, systems and methods of the present disclosure can obtain bearing housing insulation diagnostics without the need for any additional sensor. For example, in an embodiment, systems and methods of the present disclosure can detect bearing housing insulation degradation through common mode impedance analysis.

Referring now to the drawings, FIG. 1 illustrates a perspective view of a portion of a wind turbine 100 according to the present disclosure that is configured to implement the method as described herein. The wind turbine 100 includes a nacelle 102 that typically houses a generator (not shown). The nacelle 102 is mounted on a tower 104 having any suitable height that facilitates operation of wind turbine 100 as described herein. The wind turbine 100 also includes a rotor 106 that includes three blades 108 attached to a rotating hub 110. Alternatively, the wind turbine 100 may include any number of blades 108 that facilitates operation of the wind turbine 100 as described herein.

Figure 2:
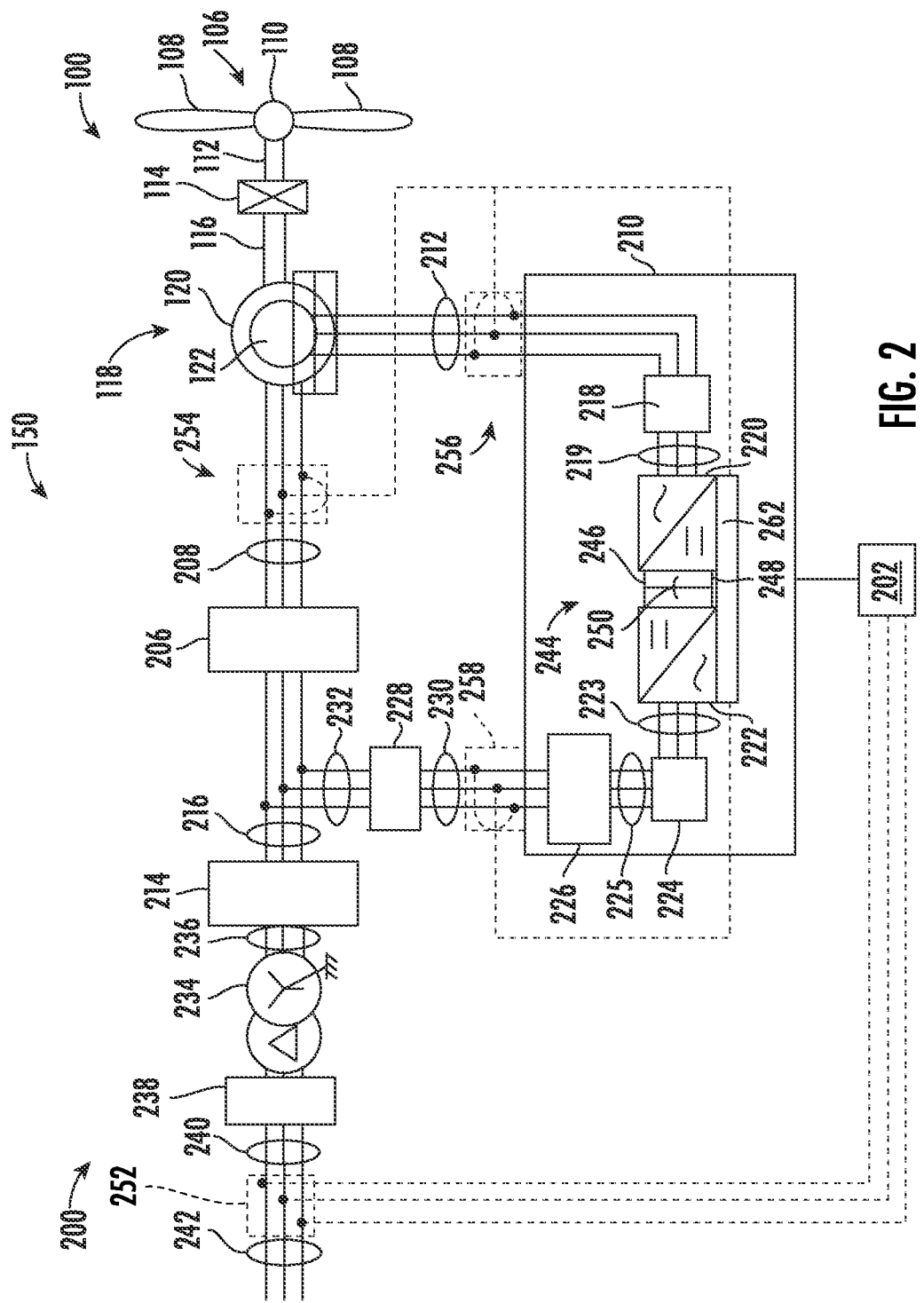
FIG. 2 illustrates a schematic view of one embodiment of an electrical power system suitable for use with the wind turbine shown in FIG. 1.
Figure 5:
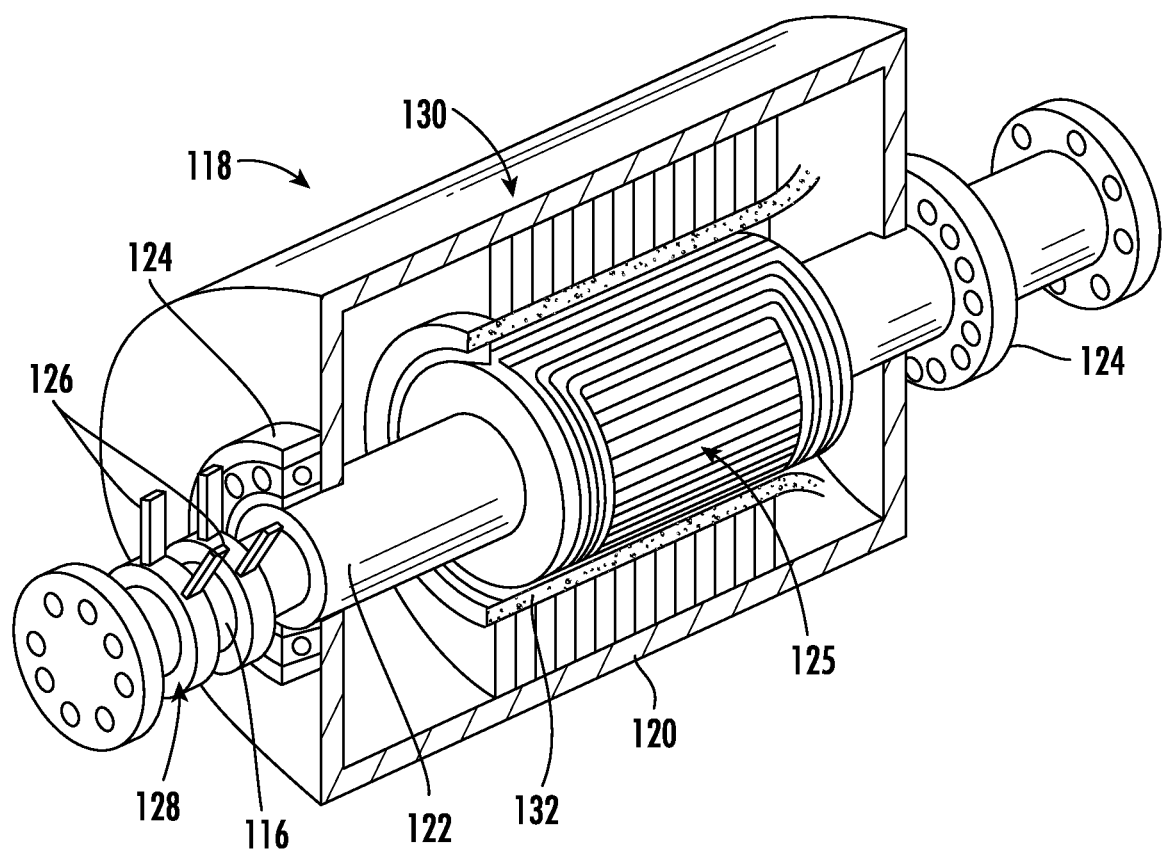
FIG. 5 illustrates a cross-sectional schematic view of one embodiment of a generator according to the present disclosure, particularly illustrating a ground brush contacting the rotor of the generator.

Referring now to FIG. 2, a schematic view of one embodiment of an electrical power system 200 that may be used with the wind turbine 100 is illustrated. Furthermore, the wind turbine 10 and the electrical power system 200 may be referred to herein collectively as a wind turbine power system 150. Thus, during operation of the wind turbine power system 150, wind impacts the blades 108 and the blades 108 transform wind energy into a mechanical rotational torque that rotatably drives a low-speed shaft 112 (also referred to herein as a rotor shaft) via the hub 110. The low-speed shaft 112 is configured to drive a gearbox 114 that subsequently steps up the low rotational speed of the low-speed shaft 112 to drive a high-speed shaft 116 (also referred to herein as a generator shaft) at an increased rotational speed. The high-speed shaft 116 is generally rotatably coupled to a generator 118 so as to rotatably drive a generator rotor 122 having field winding 125 (FIG. 5).

In one embodiment, the generator 118 may be a wound rotor, three-phase, doubly-fed induction (asynchronous) generator (DFIG) that includes a generator stator 120 magnetically coupled to a generator rotor 122. As such, a rotating magnetic field may be induced by the generator rotor 122 and a voltage may be induced within a generator stator 120 that is magnetically coupled to the generator rotor 122. In one embodiment, the generator 118 is configured to convert the rotational mechanical energy to a sinusoidal, three-phase alternating current (AC) electrical energy signal in the generator stator 120. The associated electrical power can be transmitted to a main transformer 234 via a stator bus 208, a stator synchronizing switch 206, a system bus 216, a main transformer circuit breaker 214, and a generator-side bus 236. The main transformer 234 steps up the voltage amplitude of the electrical power such that the transformed electrical power may be further transmitted to a grid via a grid circuit breaker 238, a breaker-side bus 240, and a grid bus 242.

Figure 3:
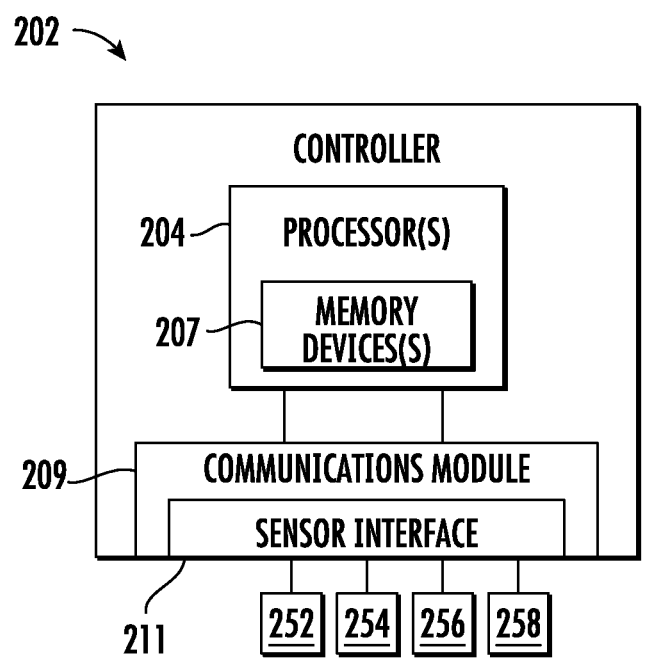
FIG. 3 illustrates a block diagram of one embodiment of a controller suitable for use with the wind turbine shown in FIG. 1.

In addition, the electrical power system 200 may include a controller 202 configured to control any of the components of the wind turbine 100 and/or implement the method steps as described herein. For example, as shown particularly in FIG. 3, the controller 202 may include one or more processor(s) 204 and associated memory device(s) 207 configured to perform a variety of computer-implemented functions (e.g., performing the methods, steps, calculations and the like and storing relevant data as disclosed herein). Additionally, the controller 202 may also include a communications module 209 to facilitate communications between the controller 202 and the various components of the wind turbine 100, e.g. any of the components of FIG. 2. Further, the communications module 209 may include a sensor interface 211 (e.g., one or more analog-to-digital converters) to permit signals transmitted from one or more sensors to be converted into signals that can be understood and processed by the processors 204. It should be appreciated that the sensors (e.g. sensors 252, 254, 256, 258) may be communicatively coupled to the communications module 209 using any suitable means. For example, as shown in FIG. 3, the sensors 252, 254, 256, 258 may be coupled to the sensor interface 211 via a wired connection. However, in other embodiments, the sensors 252, 254, 256, 258 may be coupled to the sensor interface 211 via a wireless connection, such as by using any suitable wireless communications protocol known in the art. As such, the processor 204 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 204 is also configured to compute advanced control algorithms and communicate to a variety of Ethernet or serial-based protocols (Modbus, OPC, CAN, etc.). Additionally, the memory device(s) 207 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 207 may generally be configured to store suitable computer-readable instructions that, when implemented by the processor(s) 204, configure the controller 202 to perform the various functions as described herein.

Referring back to FIG. 2, the generator stator 120 may be electrically coupled to a stator synchronizing switch 206 via a stator bus 208. In one embodiment, the generator rotor 122 may be electrically coupled to a bi-directional power conversion assembly 210 or power converter via a rotor bus 212. Alternatively, the generator rotor 122 may be electrically coupled to the rotor bus 212 via any other device that facilitates operation of electrical power system 200 as described herein. In a further embodiment, the stator synchronizing switch 206 may be electrically coupled to a main transformer circuit breaker 214 via a system bus 216.

The power conversion assembly 210 may include a first converter and a second converter. For example, as shown, the first converter may be a rotor-side converter 220 and the second converter 22 may be a line-side converter 222. Further, as shown, the power conversion assembly 210 may include a rotor filter 218 that is electrically coupled to the generator rotor 122 via the rotor bus 212. In addition, the rotor filter 218 may include a rotor-side reactor. A rotor filter bus 219 electrically couples the rotor filter 218 to the rotor-side power converter 220. Further, the rotor-side power converter 220 may be electrically coupled to the line-side power converter 222 via a single direct current (DC) link 244. Alternatively, the rotor-side power converter 220 and the line-side power converter 222 may be electrically coupled via individual and separate DC links. In addition, as shown, the DC link 244 may include a positive rail 246, a negative rail 248, and at least one capacitor 250 coupled therebetween.

In addition, a line-side power converter bus 223 may electrically couple the line-side power converter 222 to a line filter 224. Also, a line bus 225 may electrically couple the line filter 224 to a line contactor 226. In addition, the line filter 224 may include a line-side reactor. Moreover, the line contactor 226 may be electrically coupled to a conversion circuit breaker 228 via a conversion circuit breaker bus 230. In addition, the conversion circuit breaker 228 may be electrically coupled to the main transformer circuit breaker 214 via system bus 216 and a connection bus 232. The main transformer circuit breaker 214 may be electrically coupled to an electric power main transformer 234 via a generator-side bus 236. The main transformer 234 may be electrically coupled to a grid circuit breaker 238 via a breaker-side bus 240. The grid circuit breaker 238 may be connected to the electric power transmission and distribution grid via a grid bus 242.

Figure 4:
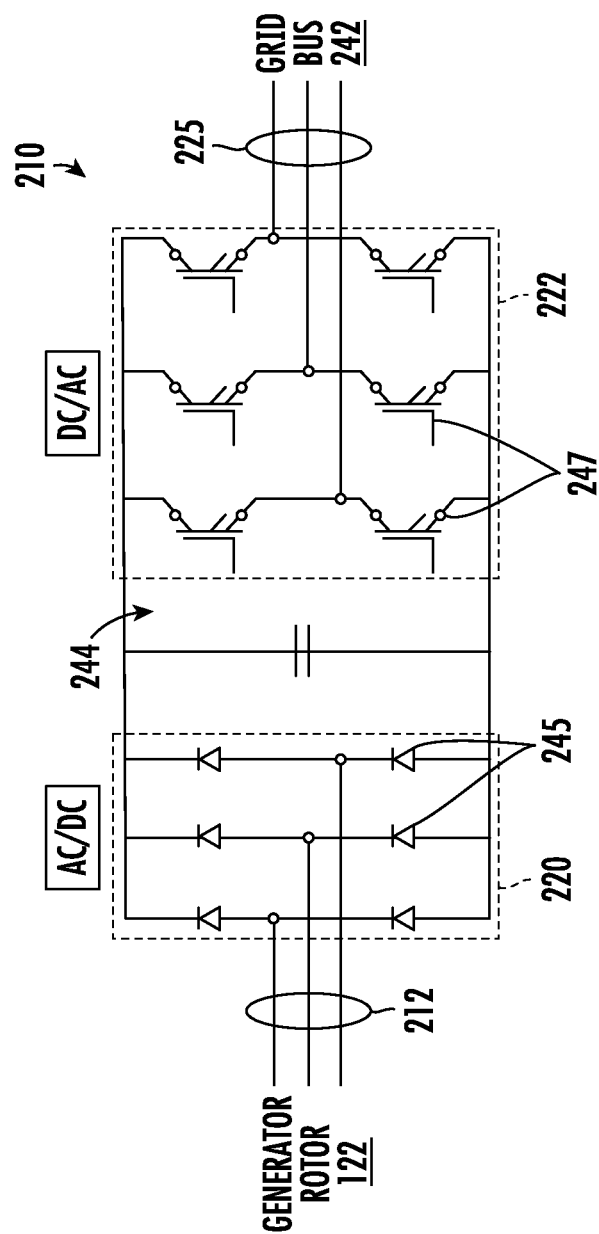
FIG. 4 illustrates a simplified schematic diagram of one embodiment of a variable frequency drive (VFD) that maintains a constant electrical frequency output on the grid side of the generator according to the present disclosure.

Referring particularly to FIGS. 2 and 4, alternating current (AC) power generated at the generator stator 120 by rotation of the rotor 106 is provided via a dual path to the grid bus 242. The dual paths are defined by the stator bus 208 and the rotor bus 212. On the rotor bus side 212, sinusoidal multi-phase (e.g. three-phase) AC power is provided to the power conversion assembly 210. The rotor-side power converter 220 converts the AC power provided from the rotor bus 212 into DC power and provides the DC power to the DC link 244. Switching elements 245 (e.g. IGBTs) used in bridge circuits of the rotor side power converter 220 can be modulated to convert the AC power provided from the rotor bus 212 into DC power suitable for the DC link 244.

The line side converter 222 converts the DC power on the DC link 244 into AC output power suitable for the electrical grid bus 242. In particular, switching elements 247 (e.g. IGBTs) used in bridge circuits of the line side power converter 222 can be modulated to convert the DC power on the DC link 244 into AC power on the line side bus 225. The AC power from the power conversion assembly 210 can be combined with the power from the stator 120 to provide multi-phase power (e.g. three-phase power) having a frequency maintained substantially at the frequency of the electrical grid bus 242 (e.g. 50 Hz/60 Hz).

It should be understood that the rotor-side power converter 220 and the line-side power converter 222 may have any configuration using any switching devices that facilitate operation of electrical power system 200 as described herein. For example, FIG. 4 illustrates a simplified schematic diagram of one embodiment of a variable frequency drive (VFD) that maintains a constant electrical frequency output on the grid side of the generator 118. As shown, the VFD configuration includes a six-switch voltage-sourced rectifier on the rotor side converter 220, a DC link capacitor 244 to minimize DC voltage variation, and a six-switch voltage-sourced inverter utilizing pulse width modulation on the grid side. Rotor-side switching elements 245 are often diodes or silicon controlled rectifiers (SCR), while the grid side-switching elements 247 are often insulated gate bipolar transistors (IGBTs). As such, the magnitude and electrical frequency of the current supplied to the generator rotor 122 through the VFD may be varied to account for changes in the rotor shaft speed and to maintain a constant output on the generator stator winding.

Further, the power conversion assembly 210 may be coupled in electronic data communication with the controller 202 and/or a separate or integral converter controller 262 to control the operation of the rotor-side power converter 220 and the line-side power converter 222. For example, during operation, the controller 202 may be configured to receive one or more voltage and/or electric current measurement signals from the first set of voltage and electric current sensors 252. Thus, the controller 202 may be configured to monitor and control at least some of the operational variables associated with the wind turbine 100 via the sensors 252. In the illustrated embodiment, each of the sensors 252 may be electrically coupled to each one of the three phases of the power grid bus 242. Alternatively, the sensors 252 may be electrically coupled to any portion of electrical power system 200 that facilitates operation of electrical power system 200 as described herein. In addition to the sensors described above, the sensors may also include a second set of voltage and electric current sensors 254, a third set of voltage and electric current sensors 256, a fourth set of voltage and electric current sensors 258 (all shown in FIG. 2), and/or any other suitable sensors.

It should also be understood that any number or type of voltage and/or electric current sensors 252, 254, 256, 258 may be employed within the wind turbine 100 and at any location. For example, the sensors may be current transformers, shunt sensors, rogowski coils, Hall Effect current sensors, Micro Inertial Measurement Units (MIMUs), or similar, and/or any other suitable voltage or electric current sensors now known or later developed in the art.

Thus, the converter controller 262 is configured to receive one or more voltage and/or electric current feedback signals from the sensors 252, 254, 256, 258. More specifically, in certain embodiments, the current or voltage feedback signals may include at least one of line feedback signals, line-side converter feedback signals, rotor-side converter feedback signals, or stator feedback signals. For example, as shown in the illustrated embodiment, the converter controller 262 receives voltage and electric current measurement signals from the second set of voltage and electric current sensors 254 coupled in electronic data communication with stator bus 208. The converter controller 262 may also receive the third and fourth set of voltage and electric current measurement signals from the third and fourth set of voltage and electric current sensors 256, 258. In addition, the converter controller 262 may be configured with any of the features described herein in regards to the controller 202. As such, the converter controller 262 is configured to implement the various method steps as described herein and may be configured similar to the controller 202.

Figure 6:
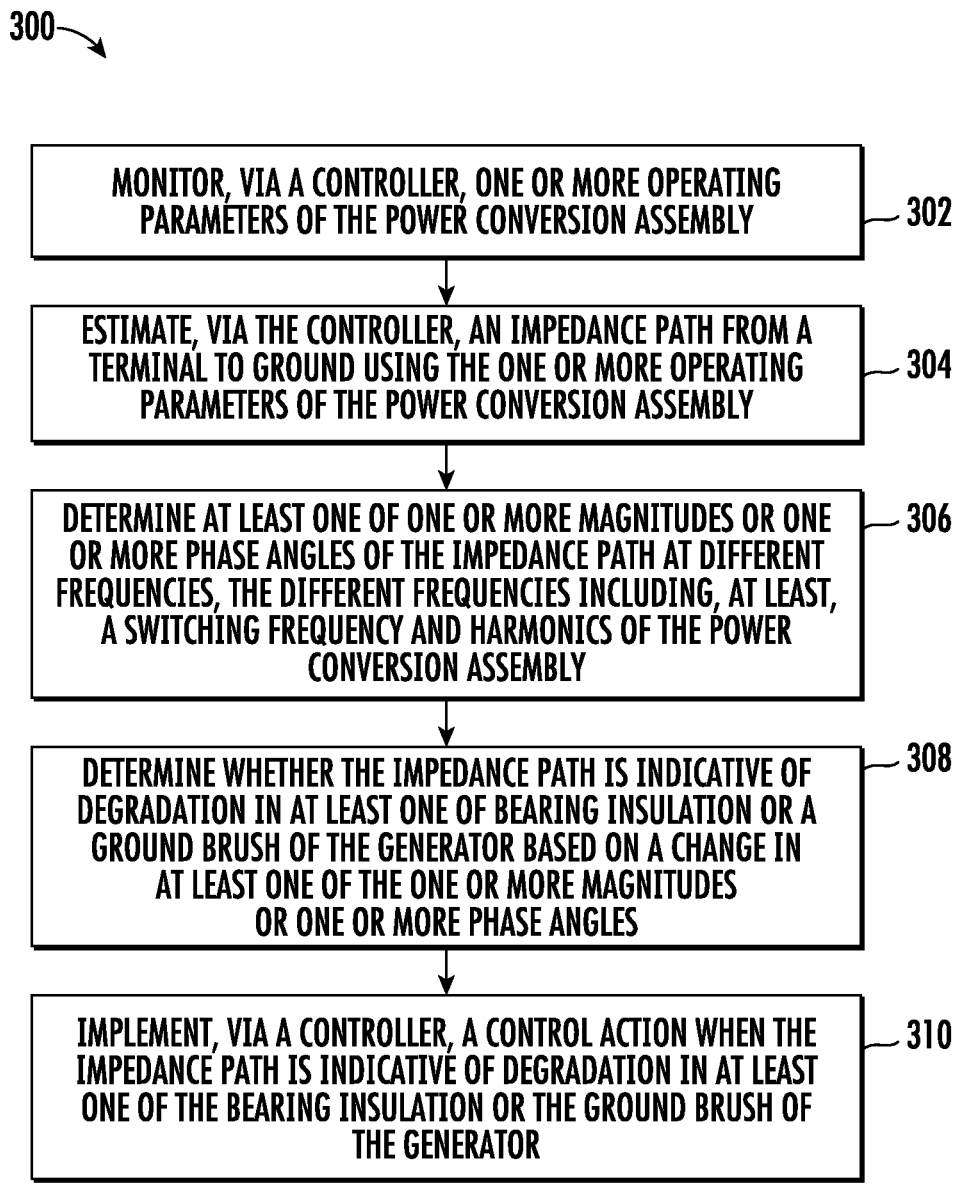
FIG. 6 illustrates a flow diagram of one embodiment of a method for preventing damage in a bearing of a generator of an electrical power system according to the present disclosure.

Referring now to FIGS. 5 and 6, various illustrations are provided to further describe the systems and methods of the present disclosure. For example, FIG. 5 illustrates a perspective cross-sectional view of one embodiment of the generator 118 of the present disclosure, particularly illustrating a plurality of brushes 126 configured with the rotor 122 thereof; and FIG. 6 illustrates a flow diagram of one embodiment of a method 300 for preventing damage in a bearing, such as bearings 124, of the generator 118 of an electrical power system 200.

As shown particularly in FIG. 5, the generator 118 may generally include a bearing housing 130 for housing the generator stator 120 and the generator rotor 122. Further, as shown, the generator rotor 122 includes the field winding 125 or coil. Moreover, as shown, the bearing housing 130 also generally includes bearing insulation 132 circumferentially arranged around the field winding 125. In addition, the generator 118 may further include one or more bearings 124 rotatably mounted into the high-speed shaft 116. Furthermore, the generator 118 may include one or more generator slip rings 128 with one or more brushes 126 secured thereto.

Accordingly, during wind turbine operation, voltage is typically induced on the high-speed shaft 116 due to capacitive coupling between the generator rotor 122 and the stator 120. The capacitive coupling is directly related to the VFD operation because a change in voltage over time (dv/dt) results in capacitive coupling. In addition, non-symmetry of the generator magnetic field may also cause shaft voltage on the high-speed shaft 116. Under normal operating conditions, the current driven by this induced shaft voltage is safely dissipated through the brushes 126. In general, such brushes 126 act as sliding contacts between the rotating slip ring and the stationary bus bars.

Further, such brushes 126 are typically constructed from a graphite/metal composite that is pressed into rectangular bar shapes and are typically mounted on the non-drive end of the generator 118. It should be understood that the generator 118 may include any suitable number of brushes 126, including particularly at least one brush. Moreover, as shown in FIG. 5, the brushes 126 may be mounted perpendicular to the high-speed shaft 116. Alternatively, the brushes 126 may have any other suitable mounting configuration with respect to the generator rotor 122. As such, some of the brushes 126 may be used to pull AC voltage off of at least one of the generator slip rings 128, while the remaining brush(es) act as a controlled path to ground (i.e. a ground brush). Further, as shown, the brushes 126 may be positioned radially outward of the generator slip ring(s) 128, with consecutive brushes in each set mounted 60 to 120 degrees apart. In addition, each brush 126 may be rigidly fixed in its axial position so as to minimize deflection under normal operational load. The brush holders may also use a constant pressure coil spring to maintain contact between the brush(es) 126 and the generator slip ring(s) 128. A micro switch may also be mounted at the base of the brush holder so as to trigger a warning signal if the brush has worn down too much.

As such, the ground brush 126 may be sized and oriented to engage the generator rotor 122 to facilitate providing an electrical connection from the generator rotor 122 to ground (not shown). Thus, the ground brush 126 is configured to protect the bearings 124 as well as all other components of the generator 118 from harmful electrical voltages and currents. More specifically, the ground brush 126 is configured to provide a low-impedance path around the bearings 124.

When the generator grounding system is compromised (i.e. the ground brush 126 loses contact with the corresponding generator slip ring 128), an excess voltage builds up on the high-speed shaft 116. This shaft voltage drives a current to find the lowest impedance path to ground. In the case of a wind turbine DFIG, this path is through the bearing housing 130. More specifically, the high-speed shaft 116 will accumulate voltage first. If the grounding system is compromised (i.e. the ground brush 126 is lifted), all components connected or coupled to the generator rotor 122 will also begin to accumulate voltage. The outer race ball pass is where the majority of the discharge occurs due to the presence of lubricating oil. The oil has a low dielectric capacity and breaks down quicker than the surrounding air or other dielectric materials. Once this voltage exceeds the dielectric capacity of the lubricating oil in the bearing, it will discharge in a pulse, causing an arc. This cycle will repeat as long as the ground brush 126 is lifted, causing pitting and fluting of the bearing track, ultimately leading to bearing failure. In addition, the aforementioned issues also cause damage to the bearing insulation 132.

As such, the present disclosure is directed to preventing such bearing damage. More specifically, as shown in FIG. 6, a flow diagram of one embodiment of the method 300 for preventing damage in a bearing, such as bearings 124, of the generator 118 of an electrical power system 200 is shown. In general, the method 300 is described herein with reference to the wind turbine 10, the electrical power system 200, the controller 202, and the generator 118 illustrated in FIGS. 1-5. However, it should be appreciated that the disclosed method 300 may be implemented with electrical power systems having any other suitable configurations. In addition, although FIG. 6 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown at (302), the method 300 includes monitoring, via a controller (such as controller 202), one or more electrical signals of the power conversion assembly 210. For example, in an embodiment, the operating parameter(s) may include current and/or voltage collected from the rotor-side power converter 220. More specifically, in an embodiment, the current may be a rotor phase current of the rotor-side power converter 220 and the voltage may be a rotor voltage.

Figure 7:
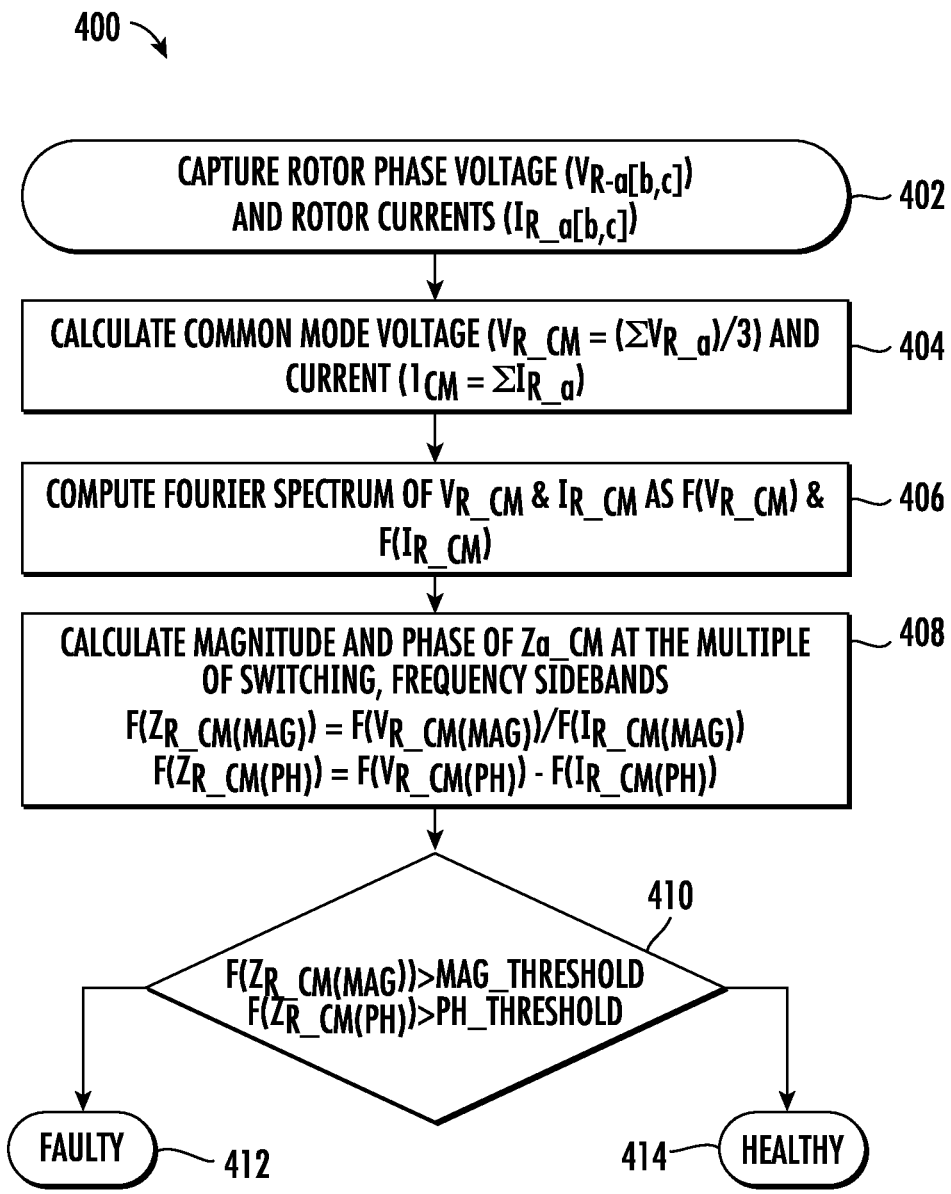
FIG. 7 illustrates a flow diagram of another embodiment of a method for preventing damage in a bearing of a generator of an electrical power system according to the present disclosure.

As shown at (304), the method 300 includes estimating, via the controller 202, an impedance path of common mode current from a terminal to ground using the one or more electrical signals of the power conversion assembly 210. In an embodiment, for example, the terminal may be a rotor terminal. More specifically, FIG. 7 illustrates a detail method 400 that, as shown at (402), includes capturing the rotor phase voltage ($V_{R\_a[b,c]}$) and rotor currents ($I_{R\_a[b,c]}$) to estimate the impedance path.

For example, referring back to FIG. 6, as shown at (404), the controller 202 can then calculate a common mode voltage ($V_{R\_CM}$) and a common mode current ($I_{R\_CM}$) using the rotor voltage and the rotor phase current of the rotor-side power converter 220, respectively. For example, as shown, the common mode voltage ($V_{R\_CM}$) and the common mode current ($I_{R\_CM}$) injected by the rotor-side power converter 220 may be calculated using Equations (1) and (2), respectively, below:

$$V_{R\_CM} = V_A + V_B + V_C \quad \text{Equation (1)}$$

$$I_{R\_CM} = I_A + I_B + I_C \quad \text{Equation (2)}$$

where $V_A$, $V_B$, and $V_C$ are the three-phase PWM voltages from the rotor-side power converter 220, and
where $I_A$, $I_B$, and $I_C$ are the three-phase PWM currents from the rotor-side power converter 220.

In certain embodiments, in-situ measurement of terminal voltages can be avoided or supplemented by pre-programming. Further, common mode voltage of specific frequencies of interest can be characterized as a function of modulation states of the converters (grid side and rotor side) and the internal voltage of the converter. The common mode current may also be measured directly through current sensor on the grounding path or on the return line.

Moreover, as shown at (406) of FIG. 7, the controller 202 can then calculate a Fourier spectrum of the common mode voltage $V_{R\_CM}$ and the common mode current $I_{R\_CM}$ as $F(V_{R\_CM})$ and $F(I_{R\_CM})$, respectively. In such embodiments, the controller 202 may also run a peak-detection on the Fourier spectrum and select frequencies having voltage peaks above a chosen magnitude, thereby preventing noise-floor from being picked up as peaks. Moreover, in an embodiment, the controller 202 is configured to analyze the Fourier spectrum in the vicinity of the switching frequency. Thus, the controller 202 can then calculate the impedance path $Z_{R\_CM}$ from the terminal to the ground as a function of the Fourier spectrum of the common mode voltage and the common mode current.

In additional embodiments, the method 300 may also include using one or more data-based approaches after estimating the impedance path in order to flag a plurality of anomaly impedance paths indicative of degradation in the bearing insulation 132 and/or the ground brush 126 and trending the plurality of anomaly impedance paths over time.

Referring back to FIG. 6, as shown at (306), the method 300 further includes determining, via the controller 202, at least one of one or more magnitudes or one or more phase angles of the impedance path $Z_{R\_CM}$ at different frequencies. The different frequencies includes, for example, at least, a switching frequency and harmonics of the power conversion assembly 210. In particular embodiments, as shown at (408) of FIG. 7, the controller 202 can determine the magnitude(s) and/or the phase angle(s) of the impedance path $Z_{R\_CM}$ at different frequencies by calculating the magnitude(s) of the impedance path at multiple switching frequency sidebands. For example, in an embodiment, the controller 202 is configured to calculate the magnitude(s) of the impedance path $Z_{R\_CM}$ at multiple switching frequency sidebands by dividing the Fourier spectrum of the common mode voltage $V_{R\_CM}$ by the Fourier spectrum of the common mode current $I_{R\_CM}$. Furthermore, in an embodiment, the controller 202 is configured to calculate the phase angle(s) of the impedance path $Z_{R\_CM}$ by subtracting the Fourier spectrum of the common mode current $I_{R\_CM}$ from the Fourier spectrum of the common mode voltage $V_{R\_CM}$.

Thus, referring back to FIG. 6, as shown at (308), the method 300 includes determining, via the controller 202, whether the impedance path is indicative of degradation in the bearing insulation 132 and/or the ground brush 126 of the generator 118 based on a change in the magnitudes and/or the phase angles. More particularly, as shown at (410) of FIG. 7, the controller 202 is configured to determine whether the impedance path is indicative of degradation in the ground brush 126 by comparing the magnitude(s) (e.g., $F(Z_{R\_CM(Mag)})$) of the impedance path to a magnitude threshold (e.g., Mag_Threshold). Similarly, as shown at (410), the controller 202 is also configured to determine whether the impedance path is indicative of degradation in the bearing insulation 132 by comparing the phase angle(s) (e.g., $F(Z_{R\_CM(Ph)})$) of the impedance path to a phase angle threshold (e.g., Ph_Threshold).

Thus, as shown at (412), if the magnitude(s) and/or the phase angle(s) of the impedance path exceed the respective thresholds, the controller 202 is configured to generate an indication of degradation. For example, if the magnitude(s) exceeds the magnitude threshold, then the indication indicates that the ground brush 126 is faulty. Similarly, as shown at (412), if the phase angle(s) exceeds the phase angle threshold, then the indication indicates that the bearing insulation 132 is faulty. Alternatively, as shown at (414), if the magnitude(s) and/or phase angle(s) do not exceed their respective thresholds, then the indication indicates that the ground brush 126 and the bearing insulation 132 are healthy.

Accordingly, referring back to FIG. 6, as shown at (310), the method 300 includes implementing, via the controller 202, a control action when the impedance path is indicative of degradation in at least one of the bearing insulation or the ground brush of the generator 118. For example, in particular embodiments, the control action may include changing an operating set point of the wind turbine 10, shutting down the wind turbine 10, generating an alarm, scheduling a repair, replacing at least one of the bearing insulation 132 or the ground brush 126, and/or any other suitable action.

Figure 8:
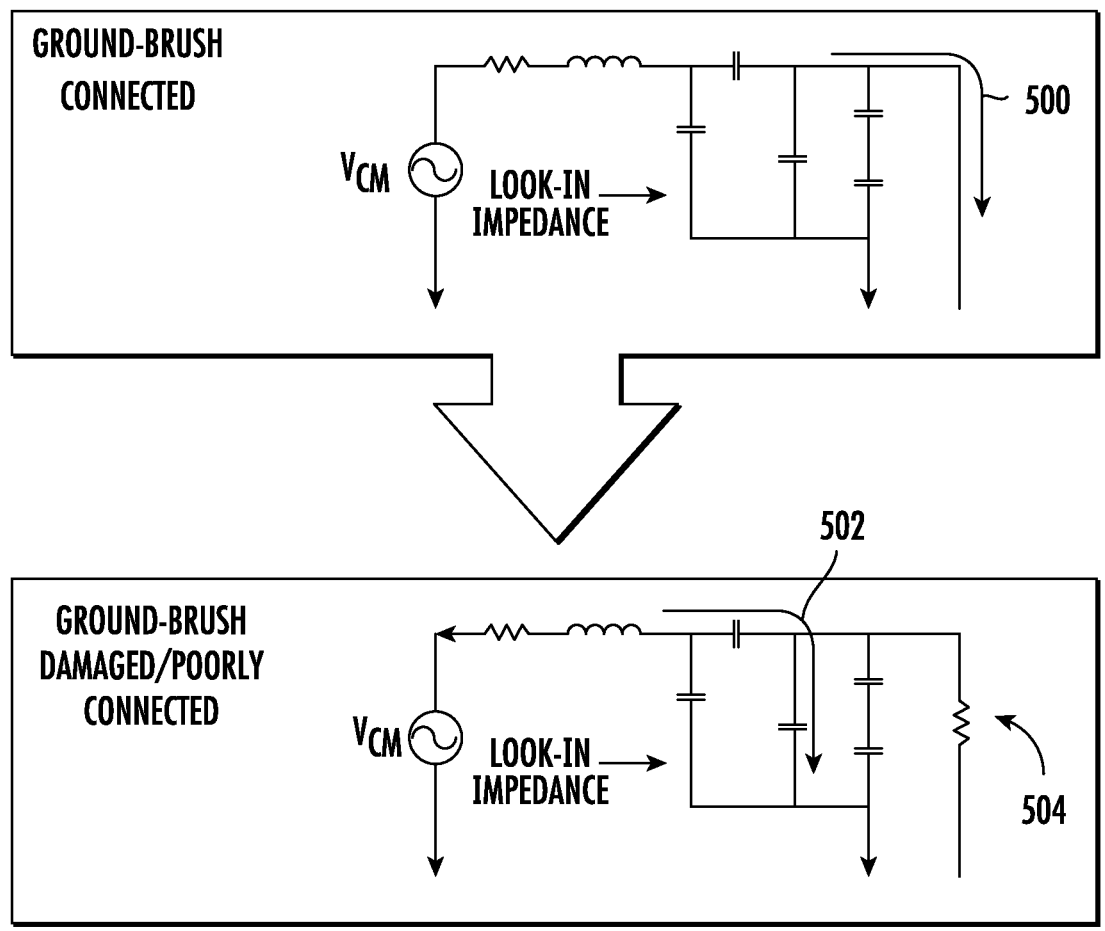
FIG. 8 illustrates a schematic diagram of one embodiment of the impact of a fault on a common-mode path in a generator according to the present disclosure.

Referring now to FIG. 8, a schematic diagram of the impact of a fault on the common mode path of an example DFIG is illustrated. As shown, when the ground brush 126 is connected (top diagram), the dominant current path follows arrow 500. In contrast, when the ground brush 126 is damaged or poorly connected (bottom diagram), the dominant current path follows arrow 502 due to increased resistance as shown at 504. More specifically, from the top figure to the bottom figure of FIG. 8, the series resistance in the ground-brush path degrades from being negligible to very large. Also, the series capacitance reduces, thereby enhancing the capacitive part of the reactance. Accordingly, a predominantly inductive look-in impedance becomes predominantly capacitive. As such, by monitoring the change in the impedance angle, the state of degradation can be estimated and trended for forecasting by monitoring whether the impedance angle has moved from the inductive quadrant towards the capacitive quadrant.

Thus, the systems and methods described herein effectively utilize the currents and voltages recorded by the rotor-side power converter 220 to estimate the look-in impedance of the path of the common mode current from the rotor terminal to the ground. Accordingly, as described herein, the magnitude and phase profile of the common-mode impedance at different frequencies indicates whether the path is behaving anomalously.

Various aspects and embodiments of the present invention are defined by the following numbered clauses:

Clause 1. A method for preventing damage in a bearing of a generator of an electrical power system, the electrical power system having a power conversion assembly with a first converter coupled to a second converter, the power conversion assembly electrically coupled to the generator, the method comprising:

monitoring, via a controller, one or more electrical signals of the power conversion assembly of the electrical power system;

estimating, via the controller, an impedance path of common mode current from a terminal to ground using the one or more electrical signals of the power conversion assembly;

determining, via the controller, at least one of one or more magnitudes or one or more phase angles of the impedance path at different frequencies, the different frequencies including, at least, a switching frequency and harmonics of the power conversion assembly;

determining, via the controller, whether the impedance path is indicative of degradation in at least one of bearing insulation or a ground brush of the generator based on a change in at least one of the one or more magnitudes or the one or more phase angles; and implementing, via the controller, a control action when the impedance path is indicative of degradation in at least one of the bearing insulation or the ground brush of the generator.

Clause 2. The method of clause 1, wherein the one or more electrical signals comprises at least one of current or voltage collected from the first converter.

Clause 3. The method of clause 2, wherein the electrical power system is part of a wind turbine power system, the first converter is a rotor-side converter of the wind turbine power system, and the second converter is a line-side converter of the wind turbine power system, and wherein the current comprises a rotor phase current of the rotor-side converter and the voltage comprises a rotor voltage.

Clause 4. The method of clause 3, wherein the terminal is a rotor terminal of the wind turbine power system.

Clause 5. The method of clause 3, wherein estimating the impedance path of the common mode current from the terminal to ground using the one or more electrical signals of the power conversion assembly further comprises:

calculating a common mode voltage and the common mode current using the rotor voltage and the rotor phase current of the rotor-side converter, respectively; calculating a Fourier spectrum of the common mode voltage and the common mode current; and calculating the impedance path from the terminal to the ground as a function of the Fourier spectrum of the common mode voltage and the common mode current.

Clause 6. The method of clause 5, wherein determining at least one of the one or more magnitudes or the one or more phase angles of the impedance path at different frequencies further comprises:

calculating the one or more magnitudes of the impedance path at multiple switching frequency sidebands by dividing the Fourier spectrum of the common mode voltage by the Fourier spectrum of the common mode current; and calculating the one or more phase angles of the impedance path at multiple switching frequency sidebands by subtracting the Fourier spectrum of the common mode current from the Fourier spectrum of the common mode voltage.

Clause 7. The method of clause 6, wherein determining whether the impedance path is indicative of degradation in at least one of bearing insulation or the ground brush of the generator based on the change in at least one of the one or more magnitudes or the one or more phase angles further comprises:

comparing the one or more magnitudes of the impedance path at multiple switching frequency sidebands to a magnitude threshold; and generating an indication of degradation occurring in the ground brush when the change in the one or more magnitudes exceeds the magnitude threshold.

Clause 8. The method of clauses 6-7, wherein determining whether the impedance path is indicative of degradation in at least one of bearing insulation or the ground brush of the generator based on the change in at least one of the one or more magnitudes or the one or more phase angles further comprises:

comparing the one or more phase angles of the impedance path at multiple switching frequency sidebands to a phase angle threshold; and generating an indication of degradation occurring in the bearing insulation when the change occurs in the one or more phase angles exceeds the phase angle threshold.

Clause 9. The method of any of the preceding clauses, further comprising:

estimating an impedance profile at a plurality of predetermined frequencies from a Fourier spectra of a plurality of common mode voltages and currents;

estimating one or more anomaly metrics using the impedance profile that are indicative of degradation in at least one of the bearing insulation or the ground brush; and trending the one or more anomaly metrics over time.

Clause 10. The method of any of the preceding clauses, wherein the control action further comprises at least one of changing an operating set point of the electrical power system, shutting down the electrical power system, generating an alarm, scheduling a repair, or replacing at least one of the bearing insulation or the ground brush.

Clause 11. The method of any of the preceding clauses, wherein the generator comprises a doubly-fed induction generator (DFIG).

Clause 12. A method for monitoring health of a generator of an electrical power system, the electrical power system having a power conversion assembly with a first converter coupled to a second converter, the power conversion assembly electrically coupled to the generator, the method comprising:

monitoring, via a controller, one or more electrical signals of the power conversion assembly of the electrical power system;

estimating, via the controller, an impedance path of common mode current from a terminal to ground using the one or more electrical signals of the power conversion assembly; and determining, via the controller, whether the impedance path is indicative of degradation in at least one of bearing insulation or a ground brush of the generator based on a change in the impedance path.

Clause 13. An electrical power system connected to a power grid, the electrical power system comprising:
a doubly-fed induction generator (DFIG) comprising a rotor and a stator;
a power conversion assembly electrically coupled to the DFIG, the power conversion assembly comprising a first converter coupled to a second converter;
a controller configured to control the electrical power system, the controller configured to perform a plurality of operations, the plurality of operations comprising:
monitoring one or more electrical signals of the power conversion assembly of the electrical power system;
estimating an impedance path of common mode current from a terminal to ground using the one or more electrical signals of the power conversion assembly;
determining at least one of a one or more magnitudes or a one or more phase angles of the impedance path at different frequencies, the different frequencies including, at least, a switching frequency and harmonics of the power conversion assembly;
determining whether the impedance path is indicative of degradation in at least one of bearing insulation or a ground brush of the DFIG based on a change in at least one of the one or more magnitudes or the one or more phase angles; and
implementing a control action when the impedance path is indicative of degradation in at least one of the bearing insulation or the ground brush of the DFIG.

Clause 14. The electrical power system of clause 13, wherein the one or more electrical signals comprises at least one of current or voltage collected from the first converter.

Clause 15. The electrical power system of clause 14, wherein the electrical power system is part of a wind turbine power system, the first converter is a rotor-side converter of the wind turbine power system, the second converter is a line-side converter of the wind turbine power system, and the terminal is a rotor terminal of the wind turbine power system, and wherein the current comprises a rotor phase current of the rotor-side converter and the voltage comprises a rotor voltage.

Clause 16. The electrical power system of clauses 13-15, wherein estimating the impedance path of the common mode current from the terminal to ground using the one or more electrical signals of the power conversion assembly further comprises:
calculating a common mode voltage and the common mode current using the rotor voltage and the rotor phase current of the rotor-side converter, respectively; calculating a Fourier spectrum of the common mode voltage and the common mode current; and
calculating the impedance path from the terminal to the ground as a function of the Fourier spectrum of the common mode voltage and the common mode current.

Clause 17. The electrical power system of clause 16, wherein determining at least one of the one or more magnitudes or the one or more phase angles of the impedance path at different frequencies further comprises:
calculating the one or more magnitudes of the impedance path at multiple switching frequency sidebands by dividing the Fourier spectrum of the common mode voltage by the Fourier spectrum of the common mode current; and
calculating the one or more phase angles of the impedance path at multiple switching frequency sidebands by subtracting the Fourier spectrum of the common mode current from the Fourier spectrum of the common mode voltage.

Clause 18. The electrical power system of clauses 16-17, wherein determining whether the impedance path is indicative of degradation in at least one of bearing insulation or the ground brush of the DFIG based on the change in at least one of the one or more magnitudes or the one or more phase angles further comprises:
comparing the one or more magnitudes of the impedance path at multiple switching frequency sidebands to a magnitude threshold; and
generating an indication of degradation occurring in the ground brush when the change in the one or more magnitudes exceeds the magnitude threshold.

Clause 19. The electrical power system of clauses 16-18, wherein determining whether the impedance path is indicative of degradation in at least one of bearing insulation or the ground brush of the DFIG based on the change in at least one of the one or more magnitudes or the one or more phase angles further comprises:
comparing the one or more phase angles of the impedance path at multiple switching frequency sidebands to a phase angle threshold; and
generating an indication of degradation occurring in the bearing insulation when the change occurs in the one or more phase angles exceeds the phase angle threshold.

Clause 20. The electrical power system of clauses 13-19, wherein the plurality of operations further comprise:
using one or more data-based approaches after estimating the impedance path in order to flag a plurality of anomaly impedance paths indicative of degradation in at least one of the bearing insulation or the ground brush; and
trending the plurality of anomaly impedance paths over time.

This written description uses examples to disclose the present disclosure, including the best mode, and also to enable any person skilled in the art to practice the present disclosure, including making and using any devices or systems and performing any incorporated methods. The patentable scope of the present disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for preventing damage in a bearing of a generator of an electrical power system, the electrical power system having a power conversion assembly with a first converter coupled to a second converter, the power conversion assembly electrically coupled to the generator, the method comprising:
monitoring, via a controller, one or more electrical signals of the power conversion assembly of the electrical power system;
estimating, via the controller, an impedance path of common mode current from a terminal to ground using the one or more electrical signals of the power conversion assembly;
determining, via the controller, at least one of one or more magnitudes or one or more phase angles of the impedance path at different frequencies, the different frequencies including, at least, a switching frequency and harmonics of the power conversion assembly;
determining, via the controller, whether the impedance path is indicative of degradation in at least one of bearing insulation or a ground brush of the generator based on a change in at least one of the one or more magnitudes or the one or more phase angles; and implementing, via the controller, a control action when the impedance path is indicative of degradation in at least one of the bearing insulation or the ground brush of the generator.

2. The method of claim 1, wherein the one or more electrical signals comprises at least one of current or voltage collected from the first converter.

3. The method of claim 2, wherein the electrical power system is part of a wind turbine power system, the first converter is a rotor-side converter of the wind turbine power system, and the second converter is a line-side converter of the wind turbine power system, and wherein the current comprises a rotor phase current of the rotor-side converter and the voltage comprises a rotor voltage.

4. The method of claim 3, wherein the terminal is a rotor terminal of the wind turbine power system.

5. The method of claim 3, wherein estimating the impedance path of the common mode current from the terminal to ground using the one or more electrical signals of the power conversion assembly further comprises:
   calculating a common mode voltage and the common mode current using the rotor voltage and the rotor phase current of the rotor-side converter, respectively;
   calculating a Fourier spectrum of the common mode voltage and the common mode current; and
   calculating the impedance path from the terminal to the ground as a function of the Fourier spectrum of the common mode voltage and the common mode current.

6. The method of claim 5, wherein determining at least one of the one or more magnitudes or the one or more phase angles of the impedance path at different frequencies further comprises:
   calculating the one or more magnitudes of the impedance path at multiple switching frequency sidebands by dividing the Fourier spectrum of the common mode voltage by the Fourier spectrum of the common mode current; and
   calculating the one or more phase angles of the impedance path at multiple switching frequency sidebands by subtracting the Fourier spectrum of the common mode current from the Fourier spectrum of the common mode voltage.

7. The method of claim 6, wherein determining whether the impedance path is indicative of degradation in at least one of bearing insulation or the ground brush of the generator based on the change in at least one of the one or more magnitudes or the one or more phase angles further comprises:
   comparing the one or more magnitudes of the impedance path at multiple switching frequency sidebands to a magnitude threshold; and
   generating an indication of degradation occurring in the ground brush when the change in the one or more magnitudes exceeds the magnitude threshold.

8. The method of claim 6, wherein determining whether the impedance path is indicative of degradation in at least one of bearing insulation or the ground brush of the generator based on the change in at least one of the one or more magnitudes or the one or more phase angles further comprises:
   comparing the one or more phase angles of the impedance path at multiple switching frequency sidebands to a phase angle threshold; and
   generating an indication of degradation occurring in the bearing insulation when the change occurs in the one or more phase angles exceeds the phase angle threshold.

9. The method of claim 1, further comprising:
   estimating an impedance profile at a plurality of predetermined frequencies from a Fourier spectra of a plurality of common mode voltages and currents;
   estimating one or more anomaly metrics using the impedance profile that are indicative of degradation in at least one of the bearing insulation or the ground brush; and
   trending the one or more anomaly metrics over time.

10. The method of claim 1, wherein the control action further comprises at least one of changing an operating set point of the electrical power system, shutting down the electrical power system, generating an alarm, scheduling a repair, or replacing at least one of the bearing insulation or the ground brush.

11. The method of claim 1, wherein the generator comprises a doubly-fed induction generator (DFIG).

12. A method for monitoring health of a generator of an electrical power system, the electrical power system having a power conversion assembly with a first converter coupled to a second converter, the power conversion assembly electrically coupled to the generator, the method comprising:
   monitoring, via a controller, one or more electrical signals of the power conversion assembly of the electrical power system;
   estimating, via the controller, an impedance path of common mode current from a terminal to ground using the one or more electrical signals of the power conversion assembly;
   determining, via the controller, at least one of one or more magnitudes or one or more phase angles of the impedance path at different frequencies, the different frequencies including, at least, a switching frequency and harmonics of the power conversion assembly; and
   determining, via the controller, whether the impedance path is indicative of degradation in at least one of bearing insulation or a ground brush of the generator based on a change in at least one of the one or more magnitudes or the one or more phase angles of the impedance path.

13. An electrical power system connected to a power grid, the electrical power system comprising:
   a doubly-fed induction generator (DFIG) comprising a rotor and a stator;
   a power conversion assembly electrically coupled to the DFIG, the power conversion assembly comprising a first converter coupled to a second converter;
   a controller configured to control the electrical power system, the controller configured to perform a plurality of operations, the plurality of operations comprising:
      monitoring one or more electrical signals of the power conversion assembly of the electrical power system;
      estimating an impedance path of common mode current from a terminal to ground using the one or more electrical signals of the power conversion assembly;
      determining at least one of a one or more magnitudes or a one or more phase angles of the impedance path at different frequencies, the different frequencies including, at least, a switching frequency and harmonics of the power conversion assembly;
      determining whether the impedance path is indicative of degradation in at least one of bearing insulation or a ground brush of the DFIG based on a change in at least one of the one or more magnitudes or the one or more phase angles; and
      implementing a control action when the impedance path is indicative of degradation in at least one of the bearing insulation or the ground brush of the DFIG.

14. The electrical power system of claim 13, wherein the one or more electrical signals comprises at least one of current or voltage collected from the first converter.

15. The electrical power system of claim 14, wherein the electrical power system is part of a wind turbine power system, the first converter is a rotor-side converter of the wind turbine power system, the second converter is a line-side converter of the wind turbine power system, and the terminal is a rotor terminal of the wind turbine power system, and wherein the current comprises a rotor phase current of the rotor-side converter and the voltage comprises a rotor voltage.

16. The electrical power system of claim 13, wherein estimating the impedance path of the common mode current from the terminal to ground using the one or more electrical signals of the power conversion assembly further comprises:
   calculating a common mode voltage and the common mode current using the rotor voltage and the rotor phase current of the rotor-side converter, respectively;
   calculating a Fourier spectrum of the common mode voltage and the common mode current; and
   calculating the impedance path from the terminal to the ground as a function of the Fourier spectrum of the common mode voltage and the common mode current.

17. The electrical power system of claim 16, wherein determining at least one of the one or more magnitudes or the one or more phase angles of the impedance path at different frequencies further comprises:
   calculating the one or more magnitudes of the impedance path at multiple switching frequency sidebands by dividing the Fourier spectrum of the common mode voltage by the Fourier spectrum of the common mode current; and
   calculating the one or more phase angles of the impedance path at multiple switching frequency sidebands by subtracting the Fourier spectrum of the common mode current from the Fourier spectrum of the common mode voltage.

18. The electrical power system of claim 16, wherein determining whether the impedance path is indicative of degradation in at least one of bearing insulation or the ground brush of the DFIG based on the change in at least one of the one or more magnitudes or the one or more phase angles further comprises:
   comparing the one or more magnitudes of the impedance path at multiple switching frequency sidebands to a magnitude threshold; and
   generating an indication of degradation occurring in the ground brush when the change in the one or more magnitudes exceeds the magnitude threshold.

19. The electrical power system of claim 16, wherein determining whether the impedance path is indicative of degradation in at least one of bearing insulation or the ground brush of the DFIG based on the change in at least one of the one or more magnitudes or the one or more phase angles further comprises:
   comparing the one or more phase angles of the impedance path at multiple switching frequency sidebands to a phase angle threshold; and
   generating an indication of degradation occurring in the bearing insulation when the change occurs in the one or more phase angles exceeds the phase angle threshold.

20. The electrical power system of claim 13, wherein the plurality of operations further comprise:
   using one or more data-based approaches after estimating the impedance path in order to flag a plurality of anomaly impedance paths indicative of degradation in at least one of the bearing insulation or the ground brush; and
   trending the plurality of anomaly impedance paths over time.

* * * * *